United States Patent
Ikeya et al.

Patent Number: 5,816,828
Date of Patent: Oct. 6, 1998

[54] SOCKET

[75] Inventors: Kiyokazu Ikeya, Shizuoka; Shinji Tsuboi, Yokohama, both of Japan

[73] Assignee: Texas Instruments Incorporated, Dallas, Tex.

[21] Appl. No.: 780,305

[22] Filed: Jan. 8, 1997

[30] Foreign Application Priority Data

Jan. 11, 1996 [JP] Japan .................................. 8-020527

[51] Int. Cl.[6] .................................................... H01R 9/09
[52] U.S. Cl. .............................................. 439/73; 439/331
[58] Field of Search .............................. 439/72, 331, 68, 439/70, 71, 525, 526, 77

[56] References Cited

U.S. PATENT DOCUMENTS

5,407,361  4/1995  Ikeya ......................................... 439/72

OTHER PUBLICATIONS

U.S. Copending Patent Application Serial No. 08/367,962 based on Japanese Patent Application No. 6–012213 filed Jan. 3, 1995.

U.S. Copending Patent Application Serial No. 08/780,305 based on Japanese Patent Application No.7–43423 filed Feb. 8, 1995.

*Primary Examiner*—Khiem Nguyen
*Assistant Examiner*—Eugene G. Byrd
*Attorney, Agent, or Firm*—Russell E. Baumann; Richard L. Donaldson; René E. Grossman

[57] ABSTRACT

A socket (2, 52) for attachment to a printed substrate (10, 60), has a central aperture therethrough. A connective part (3, 53) including a flexible insulative sheet (8, 58) is provided to cover the aperture and act as an electrically connective interface between an electrical part (31, 81) mounted in the socket and the printed substrate. The flexible sheet (8, 58) has a first contact means (5, 55) associated with a first surface of the flexible sheet for electrically connecting with leads (32, 82) of the electrical part and a second contact means (6, 56) associated with a second surface of the flexible sheet for electrically connecting with the printed substrate. An electroconductive member (7, 57) provides electrical connection between the first and second contact means. Such a socket is especially useful for testing electrical parts with high clock speeds and a large number of leads.

15 Claims, 10 Drawing Sheets

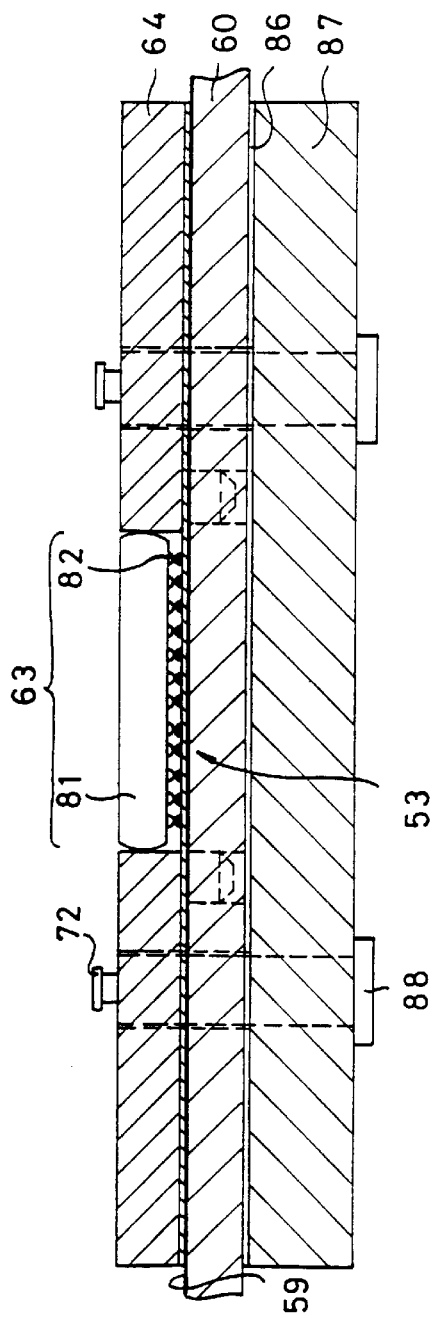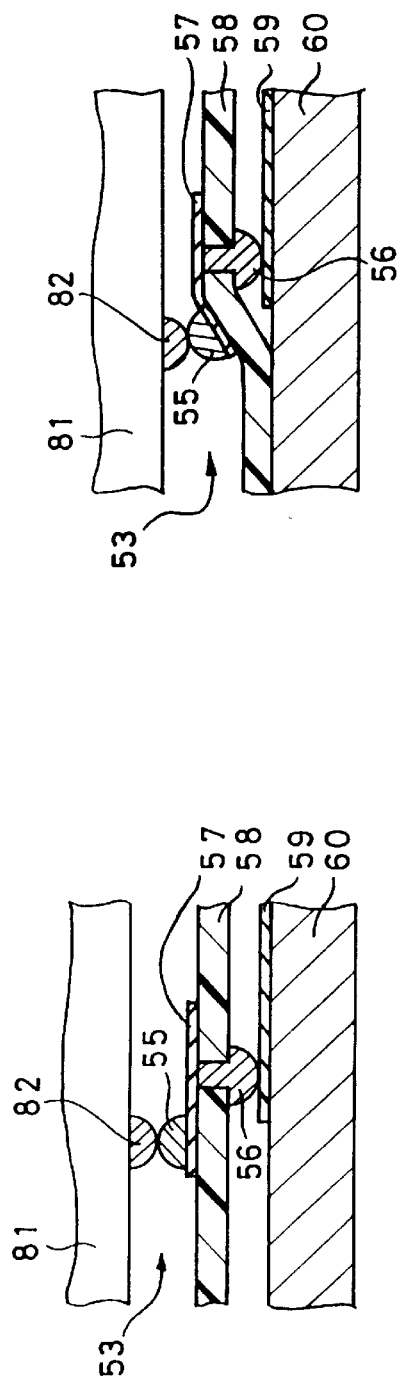

PRIOR ART
FIG. 14A
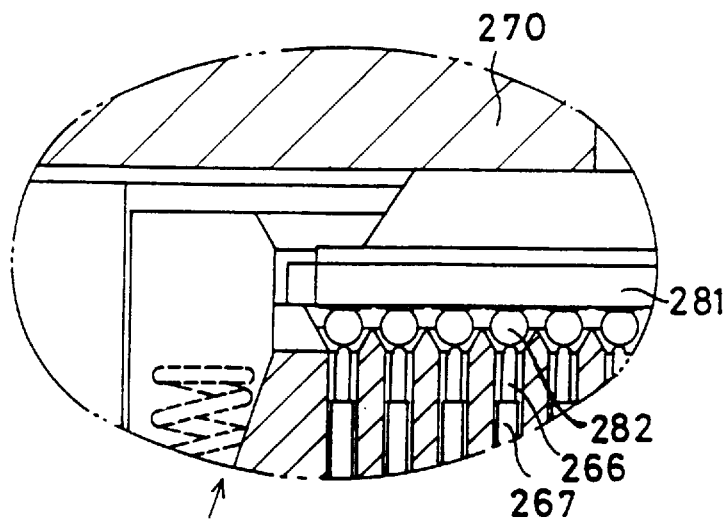
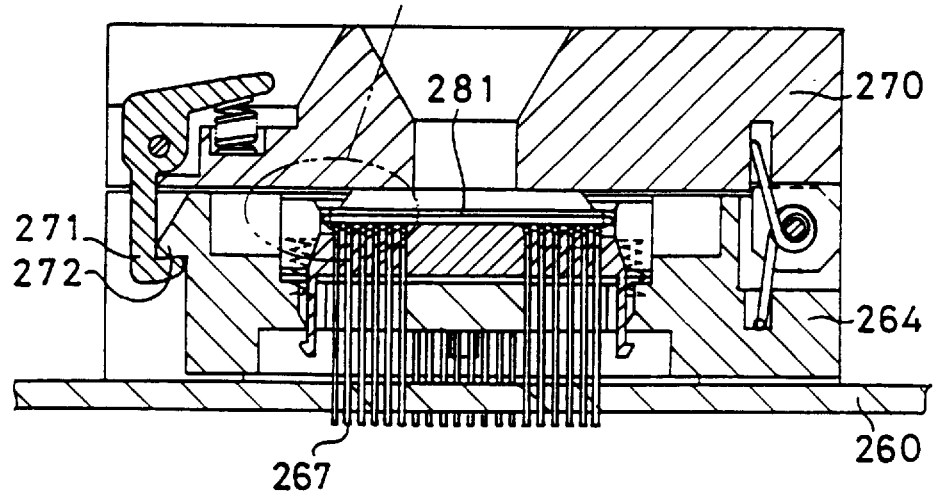
PRIOR ART
FIG. 14

SOCKET

FIELD OF THE INVENTION

This invention relates to sockets which connect an electrical part (i.e., integrated circuit—IC) with an external circuit and particularly to sockets which are suitable for mounting multi-terminal IC's.

BACKGROUND OF THE INVENTION

In the production of semiconductor parts, there has been an increase in the number of input and output terminals of the IC and accordingly, sockets used with them for testing, etc., have also had to accommodate the increase in the number of these input and output terminals.

An example of such a socket, according to prior art, is shown in FIGS. 12 and 13. This socket 212 is the one which is to be used in testing, for example, an IC 231 of the QFP type (quad flat package) and has a base 214 formed of plastic. In this base 214, a plurality of contacts 216 are arranged being made of resilient metal materials with good electrical conductivity properties. The number of contacts 216 is the same as the number of IC leads 232 that extend out of the package periphery of the IC 231 and the tip of each contact 216 is so constructed as to be able to elastically contact each IC lead 232.

The bottom portion of contact 216 is constructed to be fixed to base 214 with a bar-shaped lead portion 217 extending out of the bottom of base 214 approximately perpendicular to be soldered to printed substrate 210 by this lead 217.

On the top side of said base 214, cover 220 is attached in a freely rotatable manner by means of a shaft 218. A spring 219 has been provided on shaft 218 to bias cover 220 in an open position.

A latch 221 is provided on cover 220 being mounted on a second shaft 224. Latch 221 is positioned at one end of cover 220 to engage a claw part 222 provided on the side of base 214. During testing on socket 212, the IC 231 is mounted on positioning post 215 that has been provided on base 214 for positioning IC leads 232 relative to contact 216. Upon closing of cover 220, latch 221 engages claw part 222 and maintains this state by spring 223 that has been wound on shaft 224, thereby fixing the position of IC 231.

A convex part 226 is provided on the bottom of cover 220 so that upon closing of cover 220, IC leads 232 are pressed by convex part 226 so as to push down on contacts 216. In this state, there is good electric contact between IC leads 232 and contacts 216 with wiping action of the contact faces.

A second socket according to prior art as shown by numeral 262 in FIG. 14 is a socket which is used in the loading of IC 281 having the BGA (ball grid array) construction. Such a socket has a plurality of probe pins 267 which are inserted and arranged in the bottom of base 264 with the number of probe pins 267 being the same as the number of balls of the BGA socket. A spring is provided in each probe pin 267 at the top, and a contact portion 266 is installed at the tip of the pin 276 in such a manner as to be freely movable vertically.

Contact portion 266 of pins 267 is made to slightly stick out of the top of the baser 264 for contacting the balls 282 of IC 281 when the IC is mounted on the socket. The opposite lower end of probe pins 267 extends from the bottom of base 264 so as to be connected by soldering with the wiring pattern on printed substrate 260. In addition, this socket 262 is also constructed with cover 270 which operates similar to cover 220 described above. Cover 270 has latch 271 which engages claw part 272 in base 264.

Because of the ease of inserting and removing ICs, sockets 212 and 262 are widely used in the testing, loading and burn-in tests, etc. In order to produce the sockets in such a way that each one of the said contacts 216 and 266 contacts IC leads 232 or balls 282 respectively, it becomes necessary to install the same accurately in the socket adjusting for the pitch of each contact/pin. Accordingly, the assembling time increases and the manufacturing cost rises. In addition, contact failures tend to develop due to manufacturing variations causing the yield to be lower.

Additionally with the use of conventional contacts 216 and 266, the contact part and current flow path has had to be made longer to some extent so as to ensure the actions of the spring and the spring material for reliable contacting. Because of this fact, it has been the case that the electric distance inside the socket becomes great and the value of the LCR (inductance, capacitance, resistance model) in the socket is also large. In short, the socket, according to prior art as described above, has not been capable in all respects of satisfactory use with IC's with high clock speeds and narrow pitch between contacts.

SUMMARY OF THE INVENTION

Accordingly, it is an object of this invention to provide a socket which can be easily assembled, which can cope with the increasing trend toward the use of a larger number of lead pins/balls in ICs and which is suitable for use with an IC that acts at high device clock speeds.

The socket, according to this invention, is used for mounting an electrical part with a plurality of connective terminal parts in a freely detachable manner adapted to be attached to a printed substrate. It comprises a body portion having an aperture therethrough, a flexible sheet of insulating material positioned in said body portion to cover said aperture in said socket, first contact members associated with a first face of said flexible sheet for electrically connecting with said plurality of connective terminal parts of said electrical part, second contact members associated with a second face of said flexible sheet for electrically connecting with said printed substrate, and electroconductive members which provide electrical connection between said first contact members and said second contact members.

Further in accordance with this invention, the socket includes a cover movable between a first position and a second closed position with respect to the socket so as to correspondingly cause said flexible sheet to move from a first position to a second deformed position thereby providing reliable electrical contacting and contact wiping between said first contact member and said plurality of connective terminal parts.

Still further in accordance with this invention, the socket can include a flexible sheet made of two insulating films joined together in which the electroconductive members that provides electrical connection between first and second contact members are positioned between the two joined insulating films so as to prevent shorting between neighboring electroconductive members.

BRIEF DESCRIPTION OF THE DRAWINGS

Other objects, advantages and details of this invention appear in the following detailed description of the preferred embodiments of the invention, the detailed description referring to the drawings in which:

FIG. 5 is a cross-sectional view of a second embodiment of a socket of this invention for use with a BGA IC;

FIG. 6A is an enlarged cross-sectional view of the electrical connective part of the socket of FIG. 5 prior to finish mounting of the BGA IC in the socket;

FIG. 6B is an enlarged cross-sectional view of the electrical connective part of the socket of FIG. 5 when the BGA IC is finish mounted in the socket;

FIG. 14 is a cross-sectional view of another socket according to the prior art; and FIG. 14A shows an enlarged portion of the socket of FIG. 14.

DETAILED DESCRIPTION OF THE PREFERRED EMBODIMENTS

A first embodiment of this invention will be explained below by referring to FIGS. 1 through 4.

Figure 1:
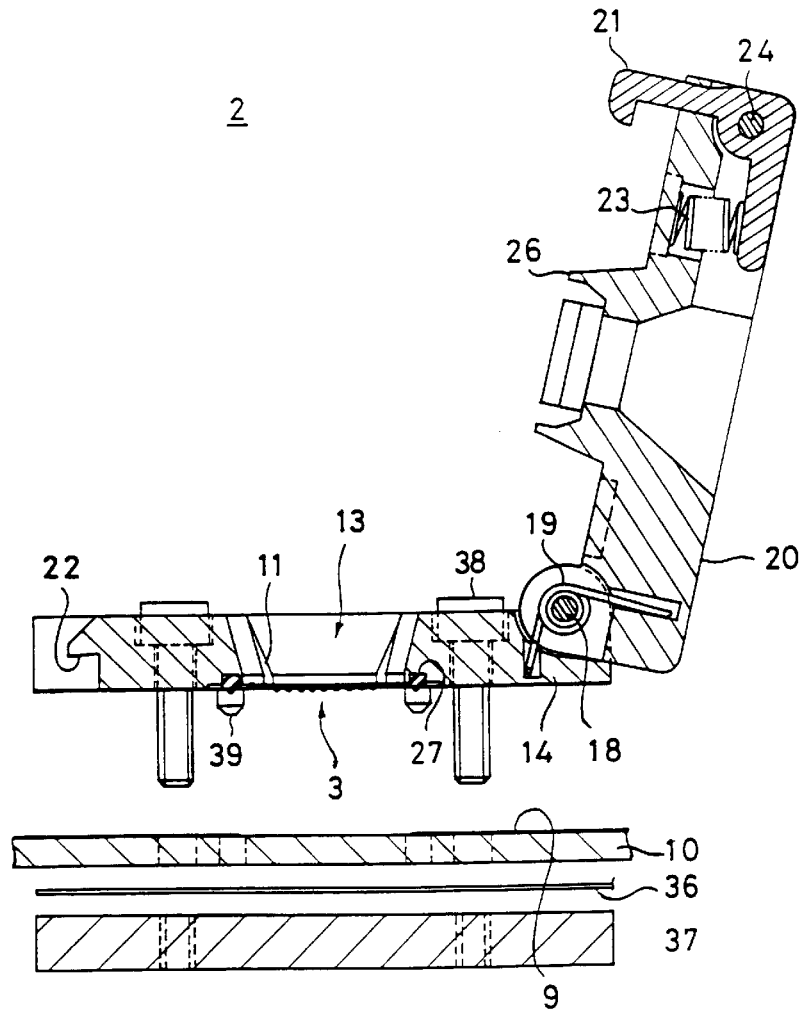
FIG. 1 is a cross-sectional view of a first embodiment of a socket of this invention with the cover in an open state.

A socket 2 constructed to receive an IC 31 having the QFP construction has a base 14 made of a plastic material approximately in a quadrilateral shape. A shaft 18 is provided on one side of the base 14. On this shaft 18, a cover 20 is freely rotatably attached to base 14. A spring 19 is wound on the shaft 18 to bias the cover 20 in an open position as is shown in FIG. 1.

A generally central aperture or through hole 13 in the form of a four sided opening is provided in base 14 for receiving IC 31 on a connective part 3 which covers the aperture 13 at the bottom of the socket.

Figure 4A:
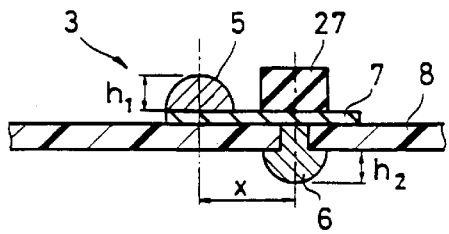
FIG. 4A is an enlarged cross-sectional view of the electrical connective part of the socket of FIG. 1 prior to attaching to the socket.

Connective part 3 comprises a flexible sheet 8 typically made of a polyimide film of approximately 25 microns in thickness as is shown in FIG. 4(a). On a first surface of flexible sheet 8, an electroconductive member 7 of a thin copper film or the like is formed by etching with a width of, for example, approximately 18 microns.

A plurality of IC terminal leads 32 extend out from the four sides of IC package 31 and are equal in number to the number of electroconductive members 7 on flexible IS sheet 8. One end of each electroconductive member 7 is arranged at such a position so as to contact each IC lead 32 when the IC 31 has been mounted in socket 2.

The electroconductive members 7 are separated from all other electroconductive members and extend out from the center of the socket farther than where contact is made with IC leads 32. There is one electroconductive member to match with each terminal lead of IC socket 31.

In a preferred embodiment of this invention, connective part 3 is produced in the following manner: First, a resist film is formed on the surface of the flexible sheet 8, photo-lithography is carried out so that the metal surface on the face of each electroconductive member 7 may be exposed only at preselected locations including where the IC lead is to be placed; next, a hole is made in flexible sheet 8 in such a way as to leave the electroconductive member 7 intact on the flexible sheet 8 and accessible from this hole, thereby exposing the metal surface from the bottom of the electroconductive member 7; then, the hole is filled by plating of a nickel film and a thin gold film to have a metal contact portion associated with each major surface of sheet 8; and lastly, a metal bump is selectively plated (grown) on both surfaces with a first location (to a height h1 of approximately 100 microns) where the IC lead is to be placed and a second location at the point of the through plated hole (height h2 of approximately 1.5 millimeters). The first and second contacts 5 and 6 are constructed by the metal bumps which are generally adjacent one another separated only by a distance χ (1.5 millimeters) as shown in FIG. 4A. Such a design provides a short socket electrical path for connecting the IC to the printed substrate.

This connective part 3 is installed on socket in such a way that flexible sheet 8 is relatively tight without wrinkles. In this connection, the first contact 5 is made to face upward and the second contact 6 is made to face downward. In the bottom of the base 14, positioned to contact flexible sheet 8 opposite to the position of second contact 6, an elastic member 27 made of a silicon resin in the shape of a square ring is arranged so that elastic member 27 and the flexible sheet 8 may adhere tightly to each other.

The flexible sheet 8 is attached on the base 14 at a point closer to the perimeter of the socket than the elastic member 27; and the portion of the flexible sheet 8 which is located inside elastic member 27, is so constructed as to be able to flex or bend.

Socket 2 is constructed in the manner described above, with positioning pins 39 being provided on the bottom of the base 14 for location in guide holes 30 provided on a printed substrate 10 to which the socket is affixed. A wiring pattern 9 of a thin copper film is provided on the printed substrate 10. When the positioning pins 39 are inserted into the guide holes 30 and the socket 2 is thereby installed on the printed substrate 10, second contact 6 contacts wiring pattern 9.

Typically, screw members are also provided in base 14 for insertion through the printed substrate 10 to be received in threaded spiral holes contained in a back-up plate 37 that is positioned on the opposite side of the printed substrate 10 from socket 2. An insulating sheet 36 is also preferably provided between printed substrate 10 and plate 37.

Figure 4B:
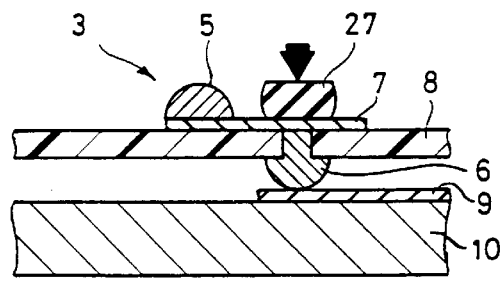
FIG. 4B is an enlarged cross-sectional view of the electrical connective part of the socket of FIG. 1 after installing on the socket.

Accordingly, in joining the socket to the printed substrate, the base 14 of socket 2 is joined to the printed substrate 10 and elastic member 27 is compressed (as is shown in FIG. 4B) thereby pressing second contact 6 in the direction of the printed substrate 10. This action guarantees good contact between the second contact 6 and the wiring pattern 9.

The design of socket 2 and printed substrate 10 is also constructed in such a manner that, even at the time when the second contact 6 is pressed to the wiring pattern 9, a gap remains between the printed substrate 10 and connective part 3 unless IC 31 fully is mounted on the socket. That is, in the unloaded state, the flexible sheet 3 and the printed substrate 10 do not contact each other inside of elastic member 27. They only contact each other when flexible sheet 8 is deformed downward toward printed substrate 10.

Figure 2:
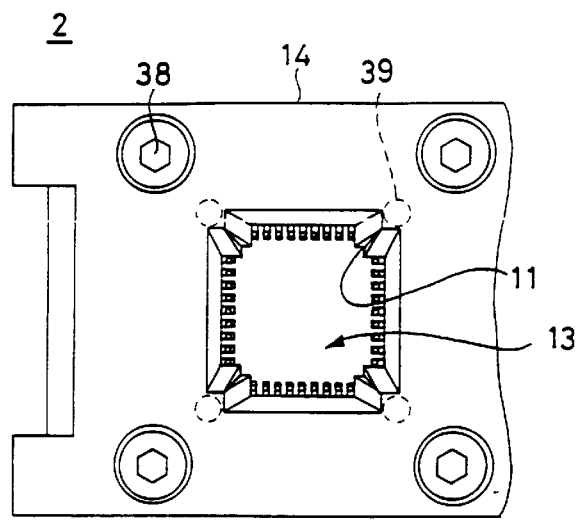
FIG. 2 is a partial plan view of the socket of FIG. 1 with its cover open.

A plan figure of this socket 2 prior to the mounting of the IC 31 is shown in FIG. 2. At four corners of aperture or socket load area 13, a guide groove 11 which is inclined in the direction of the center of the socket is provided so that the four corners of the package of the IC 31 may be dropped into the aperture 13, while same is fitted to the guide groove 11.

Figure 3:
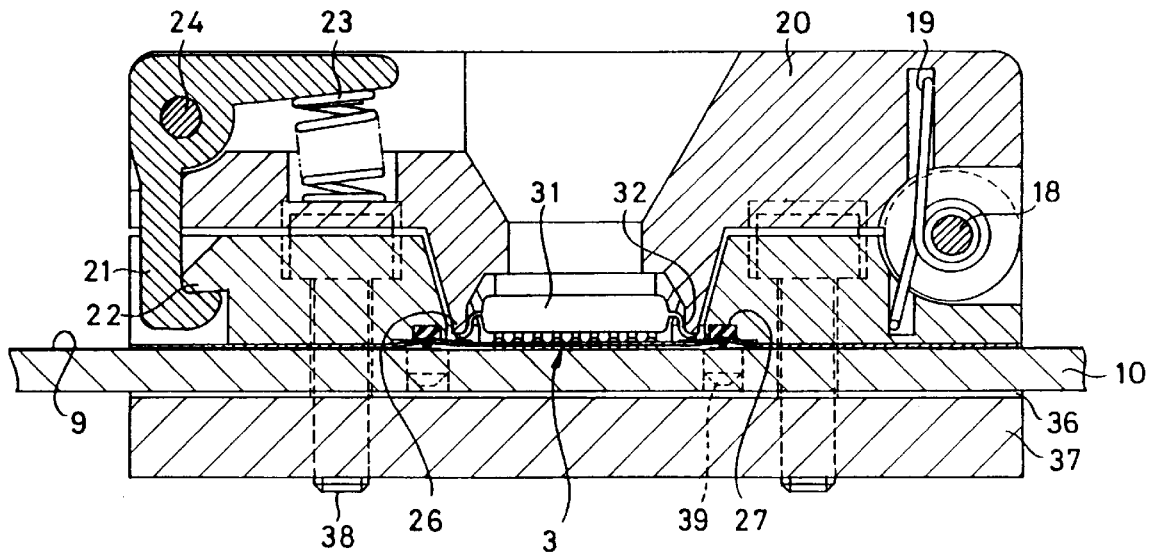
FIG. 3 is a cross-sectional view of the socket of FIG. 1 in which an IC has been mounted and the cover is in the closed position.

After the loading of IC 31 in the aperture part 13 by using this guide groove 11, the cover 20 is rotated and a latch 21 that has been provided on a shaft 24 engages a claw part 22 provided on the side of the base 14 to interlock the base to cover 20. A spring 23 is provided between the latch 21 and cover 20 to hold the cover closed as is shown in FIG. 3.

Figure 4C:
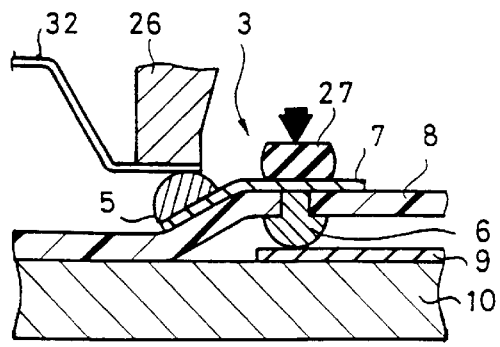
FIG. 4C is an enlarged cross-sectional view of the electrical connective part of the socket of FIG. 1 in which an IC part has been mounted on the socket with the IC lead contacting the connective part.

A pressing member 26 is provided inside cover 20 so that in connection with the closing of the cover 20, a comprehensive force is applied to IC terminal leads 32 and contacts 5. This compressive force is maintained so long as the cover is in the closed latched position by the force of the spring 23. This action against IC leads 32 and first contacts 5 causes flexible sheet 8 to bend as is shown in FIG. 4C to thereby cause wiping between the leads 32 and contacts.

When the IC 31 is ready to be removed from the socket and the cover 20 is opened, the original state of flexible sheet 8 is restored and the socket is ready to receive another IC.

Figure 10A:
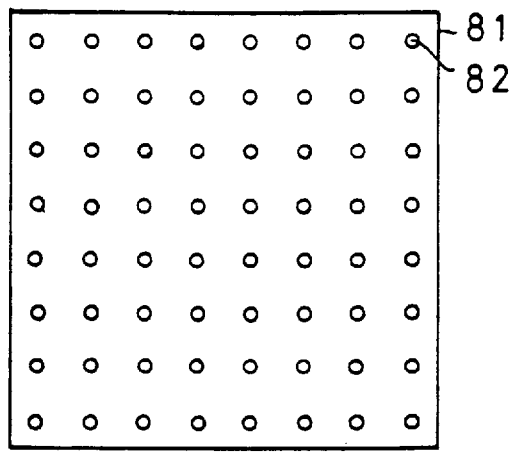
FIG. 10A shows an arrangement of metal contact balls for an IC of BGA construction.

The socket 2 which is suitable for the IC 31 having the QFP construction has been explained above. A second embodiment of a socket according to this invention will now be described which is suitable for an IC 81 having the BGA (gall grid array) construction (for example, with 8×8 metal balls) in which metal balls are arranged like a grid on the bottom reverse side of the package as is shown in FIG. 10A.

Figure 8:
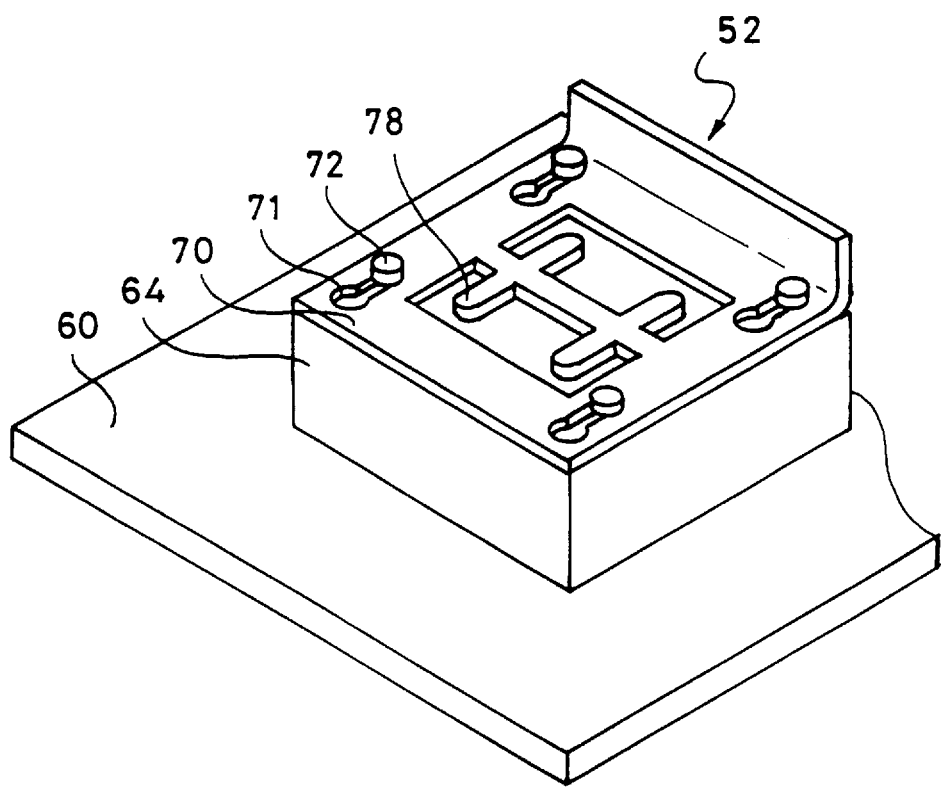
FIG. 8 is an oblique view of the socket of FIG. 5 on which the cover of FIG. 7 has been installed.
Figure 9:
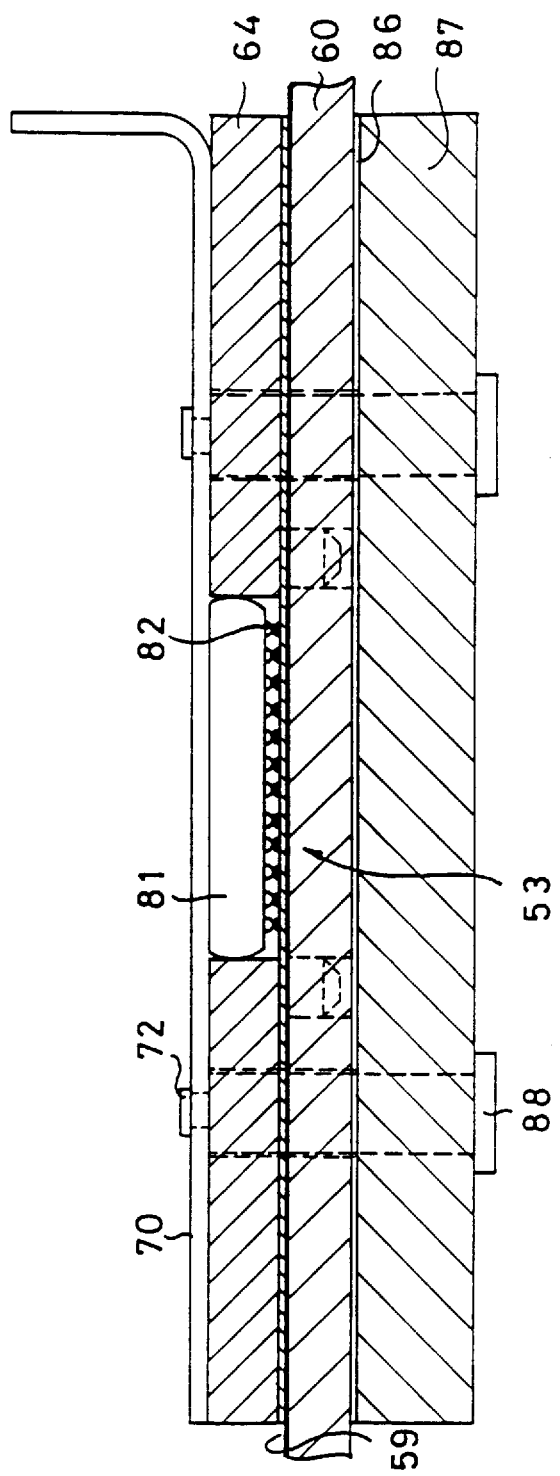
FIG. 9 is a cross-sectional view of FIG. 8.

Numeral 5 shown in FIGS. 5, 8 and 9 indicates an example of such a socket and it has a base which is approximately in the shape of a quadrilateral typically formed of an insulative plastic material. A square through-hole is provided at the center of a base 64 and a connective part 53 is provided to cover the through hole at the bottom of the socket. The through hole and connective part 53 constitute an accommodation part 63 that receives the IC 81.

This connective part 53 has a flexible sheet 58 whose thickness is about 25 microns and made of a polyimide film, as in the case of the connective part 3 of the socket 2 in the example described above. On its top surface (first face) side, the same number of electroconductive members 57 made of a thin copper film are provided as the number of metal balls 82 which are terminals of IC 81.

Each electroconductive member 57 is in the form of a band whose width is, for example, about 18 microns and one metal ball 82 is positioned on one electroconductive member 57 so that one electroconductive member may correspond to one metal ball 82.

Figure 10B:
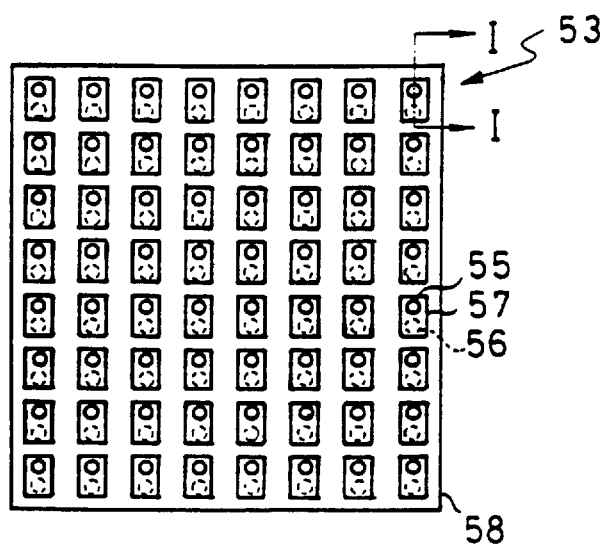
FIG. 10B shows a plan view of the connecting part of a socket for use with the IC of FIG. 10A.

A cross-section cut along I—I on the connective part 53 (see FIG. 10B) is shown in FIG. 6A. At the location of contacting between each metal ball 82 with each electroconductive member 57, a metal bump whose height is approximately 100 microns is formed by the plating of a nickel film and a thin gold film. Additionally, a hole is provided in flexible sheet 58 in such a way as to leave electroconductive member 7 intact on the flexible sheet 58 and accessible from this hole, thereby exposing the metal surface from the bottom of the electroconductive member 7. A metal member is plated at the point of the through plated hole. By the metal bumps, the first and second contacts 55 and 56 are constructed.

Flexible sheet 58 is then installed on the base 64 at its peripheral part and this base 64 is screwed to and fixed on a printed substrate 60, insulating sheet 86 and plate 87 by means of four screws 88. A wiring pattern 59 made of a thin copper film and connected to an external circuit is provided on printed substrate 60 so that the second contacts 56 and wiring pattern 59 contact each other.

As shown in FIG. 6A, a gap is provided between the flexible sheet 58 and the printed substrate 60 so that the flexible sheet 68 may be able to bend.

FIG. 5 shows the state in which the IC 81 is mounted in the IC accommodation part 63. In this state, the metal ball 82 of the IC 81 is in contact with the first contact 55. A cover 70 is provided for use with socket 52 and has an engaging hole 71 possessing a larger circular hole part and a smaller extension part therefrom for attachment of cover 70 to socket 64. Additionally, cover 70 has a comb part 78 with teeth slightly bent downward for supplying a biasing downward pressure to an IC mounted in the socket.

Figure 7:
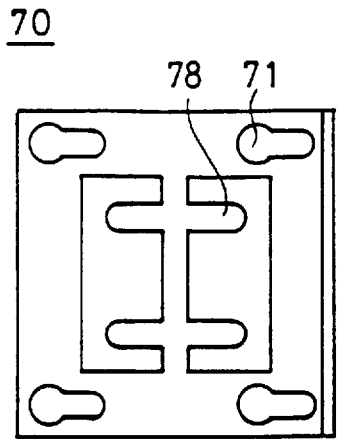
FIG. 7 is a top view of a cover used with the socket of FIG. 5.

An engaging member 72 is provided integrally with screws 88 to be received in circular hole part 71 and the extension part to secure the cover to the base. An oblique view shown in FIG. 7 shows the state in which the cover 70 is attached to base 64.

As stated above, comb part 78 supplies a spring force and presses the IC 81 down when the cover is mounted on the base thereby bringing metal balls 82 and the first contacts 55 in contact with each other as shown in FIG. 6B thereby providing good electrical connection and wiping action.

To remove IC 81 from the socket, cover 70 is removed from base 64 thereby freeing the compressive force on IC 81 so that it can be lifted out of the socket. In connection with this action, connective part 53 is restored to its original state by the spring action of the flexible sheet 58. In this manner, it becomes possible to reuse the socket 52 for testing numerous IC's.

Figure 10C:
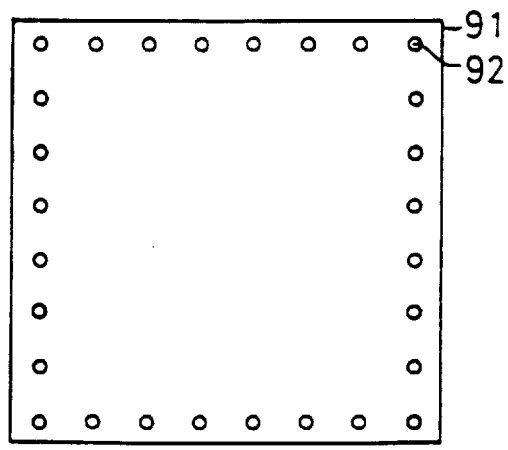
FIG. 10C shows another arrangement of metal contact balls for an IC of BGA construction.

Additionally, socket 52 is constructed in such a way that at the time when the IC 81 is pressed downward, it causes good electrical connection between second contact 56 and wiring pattern 59. In the case where the metal balls of the IC 81 are arranged around the package as is shown in FIG. 10C, it is possible to provide an elastic member as is shown by numeral 27 in FIG. 3, thereby causing the second contact 56 to tightly adhere to the wiring pattern 59.

The electroconductive members 7 and 57, as used in the socket of the first two embodiments of this invention, are formed on the surface of the flexible sheets 8 and 58. However, the flexible sheet may be formed in other ways such as using two insulating films as shown in FIGS. 11A–11D. In such cases (FIGS. 11A and 11B), two insulating films $118_1$ and $118_2$ are used to form the flexible sheet 118 as part of connective part 113 and 123.

Figure 11A:
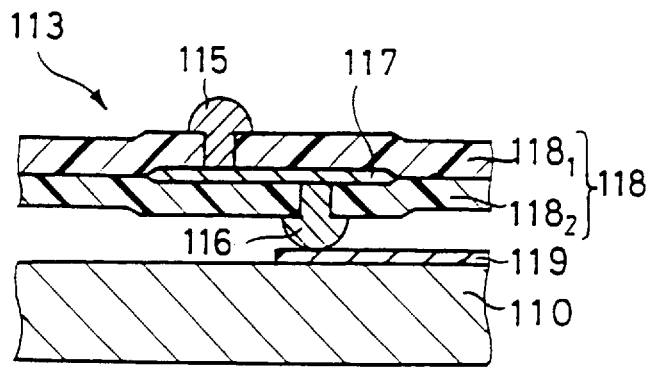
FIGS. 11A through 11D show alternate embodiments of connective parts for sockets according to this invention.

As shown in FIG. 11A, electroconductive members 117 are preferably applied to one of the insulating films and then they are joined together with holes at preselected locations made in the insulating films from both top and bottom surfaces to allow for providing a path for electrical communication between contacts provided on the top and bottom surfaces of films $118_1$ and $118_2$ and electroconductive members 117. This electrical communication can be provided by through hole and bump plating, as discussed earlier in this application, forming first and second contacts 115 and 116. A wiring pattern 119 on a printed substrate 110 is accordingly positioned for contacting second contact 116 so that the IC and an external current can be connected. As with the embodiments above, a gap is provided between connective part 113 and printed substrate 110 so as to permit flexible sheet 118 to bend for better contacting performance and then return to its original state by the spring action of flexible sheet 118 when the compressive force is removed.

Figure 11B:
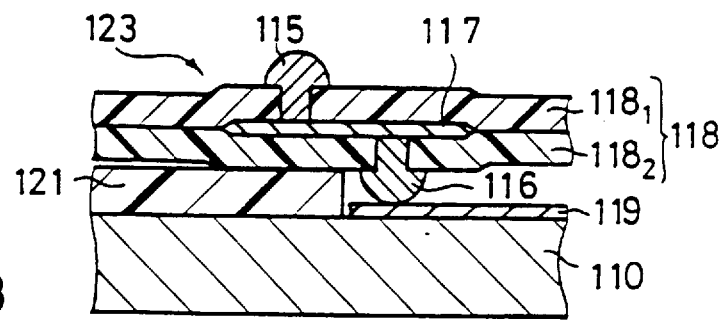

As shown in FIG. 11B, it is possible to construct a connective part 123 by providing an elastic member 121 made of a silicon rubber sheet or the like positioned between the flexible sheet 118 and the printed substrate 110. With such a design of connective part 123, the durability increases as the elastic force of elastic member 121 can be utilized.

Figure 11C:
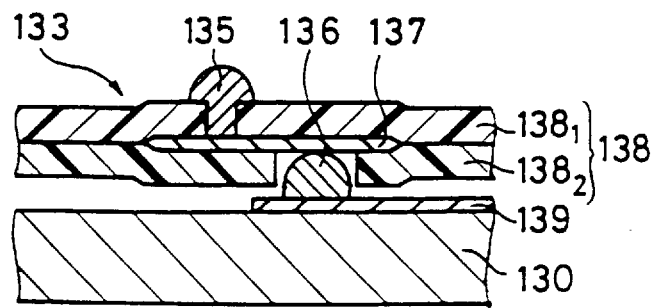

As shown in FIG. 11C, a connective part 133 can also be made by using two insulating films $138_1$ and $138_2$ to form a flexible sheet 138 with electroconductive members 137 contained therebetween. Holes are provided in each sheet to provide electrical communication between contacts 135 and electroconductive members 137 on the top surface and contact 136 positioned on wiring pattern 139 on printed substrate 130 on the bottom surface and electroconductive members 137.

Figure 11D:
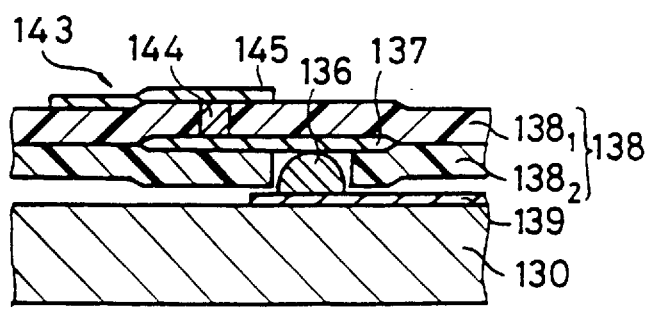
Figure 12:
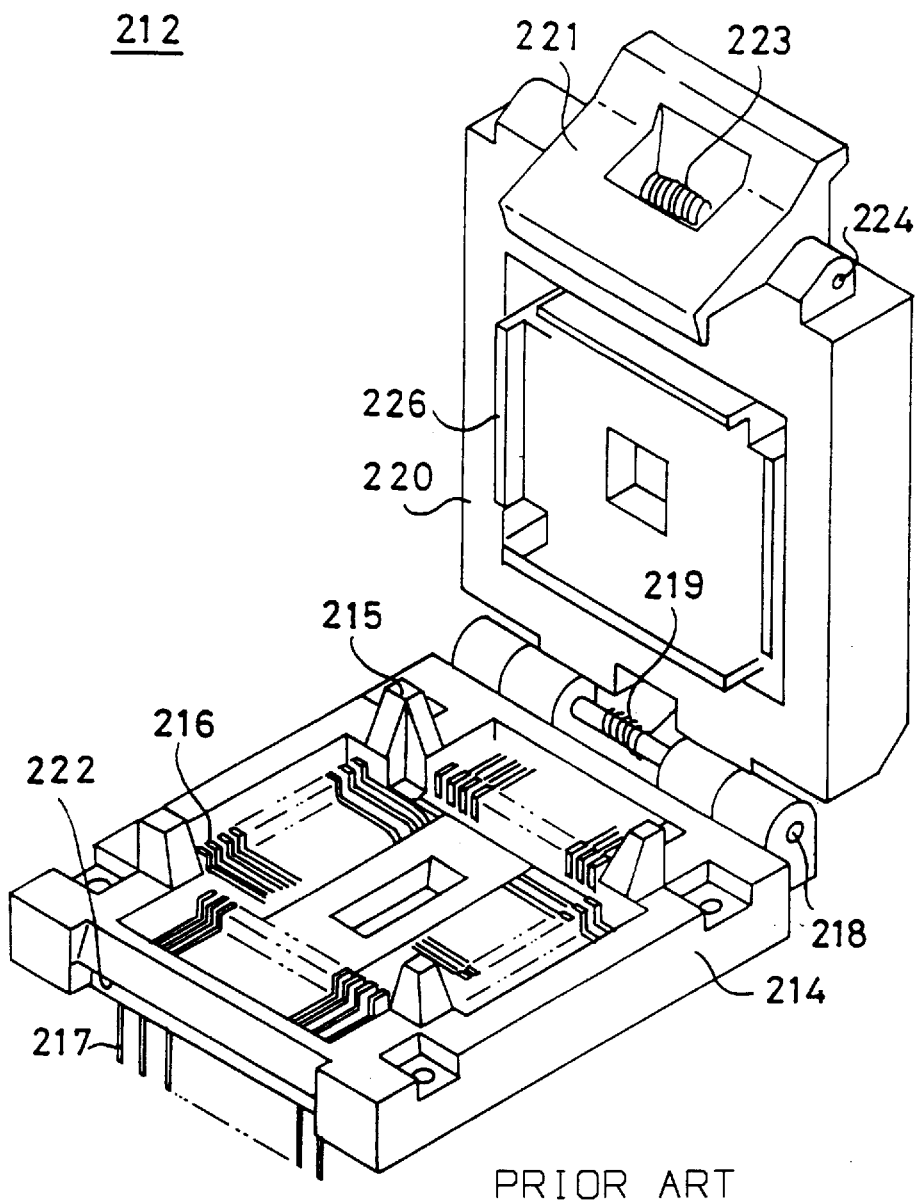
FIG. 12 is an oblique view of a socket according to the prior art.
Figure 13:
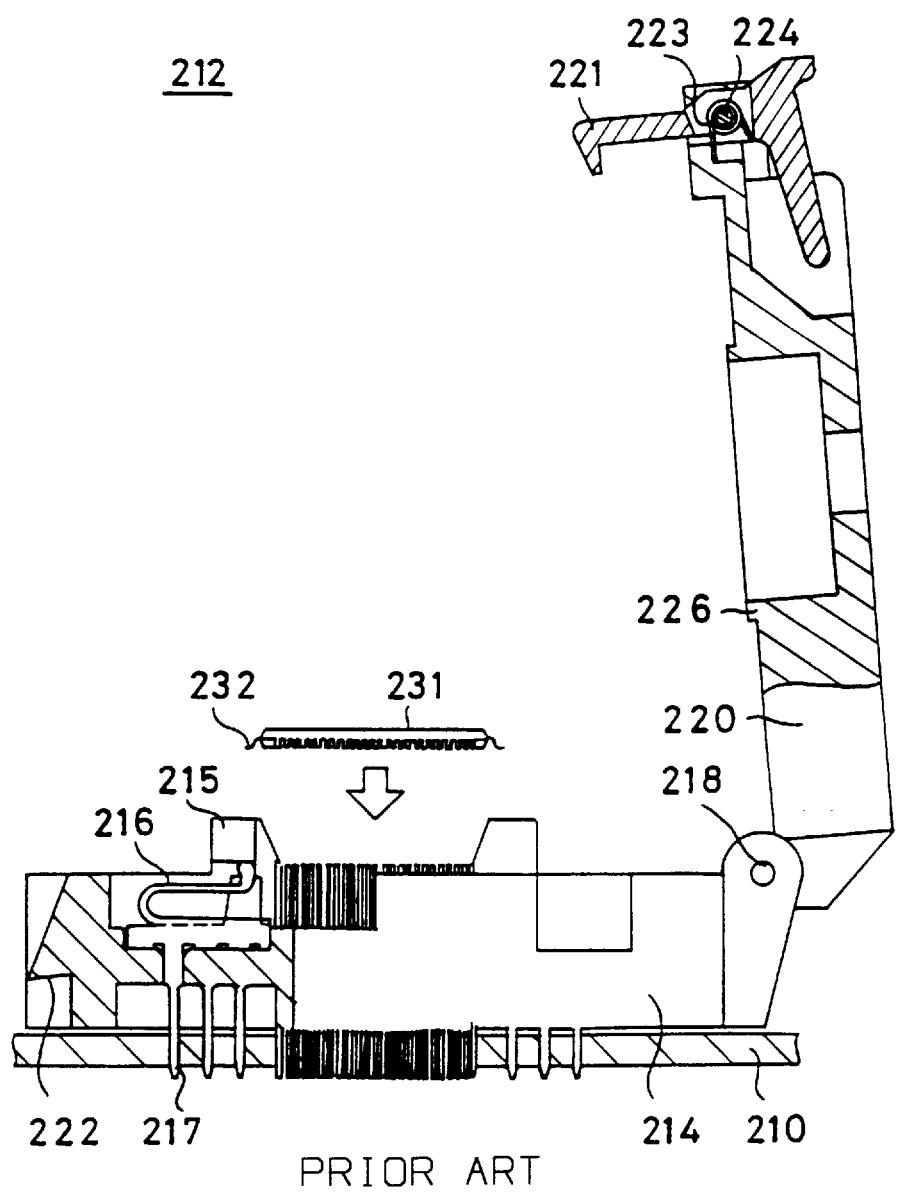
FIG. 13 is a cross-sectional view of the socket of FIG. 12.

FIG. 11D shows yet still another connective part 143 similar to the one shown in FIG. 11C except a connective part 143 including plated parts 144 and 145 is used to replace first contact bump 135.

Accordingly, the present invention provides a socket which is reliable in operation, has a short socket electrical path with first and second contacting means generally adjacent one another and is easy to produce even with high contact densities.

This invention has been described above with reference to specific embodiments; however, it is intended to embrace all such alternative modifications and variations as fall within the spirit and scope of the appended claims. By way of example, the various materials suggested in this application for the elastic member and insulating films can be substituted with other suitable materials as can the metals used for the electrical contacting bumps/members. Also, it is possible to solder the electroconductive member that has been provided on the flexible sheet to the wiring pattern on the printed substrate to make the second contact. This approach does, however, make the separation of the members more difficult.

We claim:

1. A socket for mounting an electrical part with a plurality of connective terminal parts in a freely detachable manner adapted to be attached to a printed substrate comprising a body portion having an aperture therethrough, a flexible sheet of insulating material positioned to cover said aperture in said socket, a first socket means associated with a first face of said flexible sheet for electrically connecting with said plurality of connective terminal parts of said electrical part, a second contact means associated with a second face of said flexible sheet for directly electrically connecting with said printed substrate, and electroconductive means which electrically connects said first contact means and said second contact means.

2. A socket according to claim 1 further including a cover attached to said body portion of said socket movable between a first position and a second closed position with respect to said socket body wherein said cover holds the plurality of connective terminals parts in contact with said first contact means when in the second closed position.

3. A socket according to claim 2 further including a holding means contained in the cover and positioned for biasing said plurality of connective terminal parts in contact with said first contact means when said cover is in the second closed position.

4. A socket according to claim 1 wherein said body of said socket further includes attachment means for securely joining said socket body to said printed substrate.

5. A socket according to claim 1 wherein said printed substrate includes a preselected wiring pattern which makes electrical contact with said second contact means when said socket body is joined to said printed substrate.

6. A socket according to claim 5 further including an elastic member in said body of said socket which compressively presses said second contact means in contact with said preselected wiring pattern when said socket is joined to said printed substrate.

7. A socket according to claim 3 wherein said flexible sheet moves from a first position when said cover is in said first position to a second deformed position when said cover is in said section closed position thereby providing contact wiping between said first contact means and said plurality of connective terminal parts.

8. A socket according to claim 7 which includes a central gap between said flexible sheet and said printed substrate when said socket body is joined to said printed substrate.

9. A socket according to claim 8 wherein a flexible member is provided in said gap.

10. A socket according to claim 1 wherein said flexible sheet is made from two insulating films joined together with said electroconductive means positioned therebetween so as to prevent shorting between individual members of said electroconductive means.

11. a socket according to claim 7 wherein said flexible sheet is made from two insulating films joined together with said electroconductive means positioned therebetween so as to prevent shorting between individual members of said electroconductive means.

12. A socket according to claim 11 which includes a central gap between said flexible sheet and said printed substrate when said socket body is joined to said printed substrate.

13. A socket according to claim 12 wherein a flexible member is provided in said gap.

14. A socket according to claim 1 wherein said first contact means and said second contact means each has a plurality of contact members having raised bump portions and said electroconductive means has a plurality of electroconductive members for making electrical connection between the contact members of the first contact means and the contact members of the second contact means.

15. A socket for mounting an electrical part with a plurality of connective terminal parts in a freely detachable manner adapted to be mounted to a printed substrate comprising a body portion having an aperture therethrough, a connective, part for receiving said electrical part and electrically connecting said electrical part to a printed substrate, said connective part comprising a flexible sheet of insulating material positioned to cover said aperture at the bottom of said socket, a plurality of first contact members associated with a first face of said flexible sheet for making electrical connection with said plurality of connective terminal parts of said electrical part, a plurality of second contact members associated with a second face of said flexible sheet for directly making electrical connection with said printed substrate and electroconductive members which provide electrical connection between said first contact members and said second contact members and a cover attached to said socket body movable between a first open position and a second closed position with respect to said socket body wherein said cover holds the plurality of connective terminal parts biasingly in contact with said plurality of first contact members when in the second closed position.

* * * * *